(12) United States Patent
Worley et al.

(10) Patent No.: US 8,536,893 B2
(45) Date of Patent: Sep. 17, 2013

(54) CIRCUIT FOR MEASURING MAGNITUDE OF ELECTROSTATIC DISCHARGE (ESD) EVENTS FOR SEMICONDUCTOR CHIP BONDING

(75) Inventors: Eugene R. Worley, Irvine, CA (US); Brian Matthew Henderson, Escondido, CA (US)

(73) Assignee: QUALCOMM Incorporated, San Diego, CA (US)

( * ) Notice: Subject to any disclaimer, the term of this patent is extended or adjusted under 35 U.S.C. 154(b) by 849 days.

(21) Appl. No.: 12/577,780

(22) Filed: Oct. 13, 2009

(65) Prior Publication Data

US 2010/0225347 A1 Sep. 9, 2010

Related U.S. Application Data

(60) Provisional application No. 61/158,505, filed on Mar. 9, 2009.

(51) Int. Cl.
*G01R 31/02* (2006.01)

(52) U.S. Cl.
USPC .................. 324/762.06; 324/113; 361/56

(58) Field of Classification Search
USPC .............. 324/762.06, 113; 361/56, 111, 91.1; 438/14–18
See application file for complete search history.

(56) References Cited

U.S. PATENT DOCUMENTS

| | | | |
|---|---|---|---|
| 5,825,603 A * | 10/1998 | Parat et al. .................... | 361/111 |
| 6,014,305 A | 1/2000 | Yu | |
| 6,180,426 B1 * | 1/2001 | Lin .................................. | 438/15 |
| 6,459,553 B1 * | 10/2002 | Drapkin et al. .................. | 361/56 |
| 7,027,276 B2 * | 4/2006 | Chen ............................... | 361/56 |
| 7,072,161 B2 * | 7/2006 | Chen ............................. | 361/91.1 |
| 8,000,067 B1 * | 8/2011 | Jin et al. ........................... | 361/56 |
| 2006/0114629 A1 * | 6/2006 | Wu et al. ......................... | 361/56 |
| 2008/0074817 A1 * | 3/2008 | Crain et al. .................. | 361/91.1 |
| 2008/0123228 A1 | 5/2008 | Hung | |
| 2009/0091870 A1 * | 4/2009 | Huang et al. .................... | 361/56 |

FOREIGN PATENT DOCUMENTS

| | | |
|---|---|---|
| CN | 1744310 A | 3/2006 |
| JP | H0772224 A | 3/1995 |
| JP | 2003307544 A | 10/2003 |
| JP | 2004132810 A | 4/2004 |
| JP | 2008124442 A | 5/2008 |
| JP | 2008249731 | 10/2008 |
| TW | 511271 B | 11/2002 |

OTHER PUBLICATIONS

International Search Report—PCT/ US2010/026697, International Search Authority—European Patent Office Jul. 8, 2010.

(Continued)

*Primary Examiner* — Arleen M Vazquez
(74) *Attorney, Agent, or Firm* — Michelle S. Gallardo (57) ABSTRACT

A circuit for recording a magnitude of an ESD event during semiconductor assembly includes a voltage divider connected between an input and a ground. The circuit also includes a measurement block having a recorder device. Each measurement block receives current from a segment of the voltage divider. The magnitude of the ESD event is determined based upon a read-out of the measurement devices after the ESD event. The recorder device may be a capacitor that would be damaged during the ESD event. During the ESD event the capacitor may be damaged. Reading out the recorder device determines if the magnitude of the ESD event exceeded a threshold magnitude that damages the capacitor.

23 Claims, 9 Drawing Sheets

(56) References Cited

OTHER PUBLICATIONS

Written Opinion—PCT/ US2010/026697, International Search Authority—European Patent Office Jul. 8, 2010.
Terletzki H et al: "Electrostatic discharge test structures for CMOS circuits" Microelectronic Test Structures, 1989. ICMTS 1989. Proceedings of the 1989 International Conference on Edinburgh, UK Mar. 13-14, 1989, New York, NY, USA,IEEE, US LNKD- DOI:10. 1109/ICMTS.1989.39319, Mar. 13, 1989, pp. 255-260, XP010043046 ISBN: 978-0-87942-714-6.
Shesha Jayaram et al., "High-Divider-Ratio Fast-Response Capacitive Dividers for High-Voltage Pulse Measurements", IEEE Transactions on Industry Applications, vol. 36, No. 3, May 1, 2000, ISSN: 0093-9994.

* cited by examiner

CIRCUIT FOR MEASURING MAGNITUDE OF ELECTROSTATIC DISCHARGE (ESD) EVENTS FOR SEMICONDUCTOR CHIP BONDING

CROSS REFERENCE TO RELATED APPLICATION

This application claims the benefit of U.S. Provisional Patent Application No. 61/158,505, entitled "A Circuit For Measuring Magnitude Of Electrostatic Discharge (ESD) Events For Semiconductor Chip Bonding" to WORLEY et al., filed Mar. 9, 2009.

TECHNICAL FIELD

The present disclosure generally relates to integrated circuits (ICs). More specifically, the present disclosure relates to IC assembly, and even more specifically to measuring electrostatic discharge (ESD) events in assembled ICs.

BACKGROUND

Electrostatic discharge (ESD) events are a common part of everyday life and some of the larger discharges are detectable by the human senses. Smaller discharges go unnoticed by human senses because the ratio of discharge strength to surface area over which the discharge occurs is very small.

Integrated circuits (ICs) have been shrinking at an incredible rate over past decades. By way of example, transistors in ICs have shrunk to 32 nm and will likely continue to shrink. As transistors shrink in size, the supporting components around transistors generally shrink as well. The shrinking of IC dimensions decreases the ESD tolerance of transistors thereby increasing the sensitivity of integrated circuits to ESD stress.

An ESD event occurs when an object at a first potential comes near or into contact with an object at second potential, resulting in single event discharge. Rapid transfer of charge from the first object to second object occurs such that the two objects are at approximately equal potential. Where the object with lower charge is an IC, the discharge attempts to find the path of least resistance through the IC to a ground. Often, this path flows through interconnects. Any part of this path that is unable to withstand the energy associated with the discharge sustains damage.

Fabrication sites where the manufacturing of integrated circuits is carried out have matured and implemented procedures to prevent ESD events during manufacturing. For example, design rules assure that large charges do not accumulate during manufacturing. Conventionally, ESD protective structures are also built into the substrate and connected to the devices for protection. These structures consume a considerable amount of area (tens to hundreds of square microns for each ESD buffer) on the substrate that could otherwise be used for active circuitry.

One recent development in further advancing IC capabilities is stacking ICs to form a 3-D structure or stacked IC having multiple tiers. For example, a cache memory may be built on top of a microprocessor. The resultant stacked IC has a significantly higher density of devices, but also requires significantly more complex manufacturing methods than an individual IC.

For stacked ICs, manufacturers may create a first-tier IC at a first fabrication site and create a second-tier IC at a second fabrication site. A third fabrication or assembly site may then assemble the tiers into a stacked IC. When tiers of the ICs are bonded during die-to-die bonding at the third fabrication site they may experience an ESD event because each tier may be charged to a different potential. The magnitude of such ESD events during die-to-die bonding is unknown. Moreover, no standard procedures for handling stacked ICs have been implemented.

As a result, there is a need to measure and record values of ESD events during die-to-die bonding so that appropriate handling procedures may be developed and ESD circuitry on the stacked IC may be optimized.

BRIEF SUMMARY

According to one aspect of the disclosure, a circuit for recording a magnitude of an ESD event during semiconductor assembly includes a voltage divider connected between a first potential and a second potential. The voltage divider provides a node having a discrete voltage level different from the first potential and the second potential. The circuit also includes a measurement block coupled to the node and having a recorder device that records the discrete voltage level.

According to another aspect of the disclosure, a method of measuring an ESD event during semiconductor assembly includes reading out a first voltage from a first recorder device in a first measurement block. The method also includes reading out a second voltage from a second recorder device in a second measurement block. The method further includes determining from the first voltage and the second voltage a magnitude of the ESD event.

According to yet another aspect of the disclosure, a circuit for measuring an ESD event in an integrated circuit includes means for dividing a voltage that occurs during the ESD event into a plurality of discrete voltage levels. The circuit also includes a plurality of means for recording discrete voltage levels. Each recording means is coupled to the dividing means and receives a current from the dividing means.

The foregoing has outlined rather broadly the features and technical advantages of the present disclosure in order that the detailed description that follows may be better understood. Additional features and advantages will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the technology of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
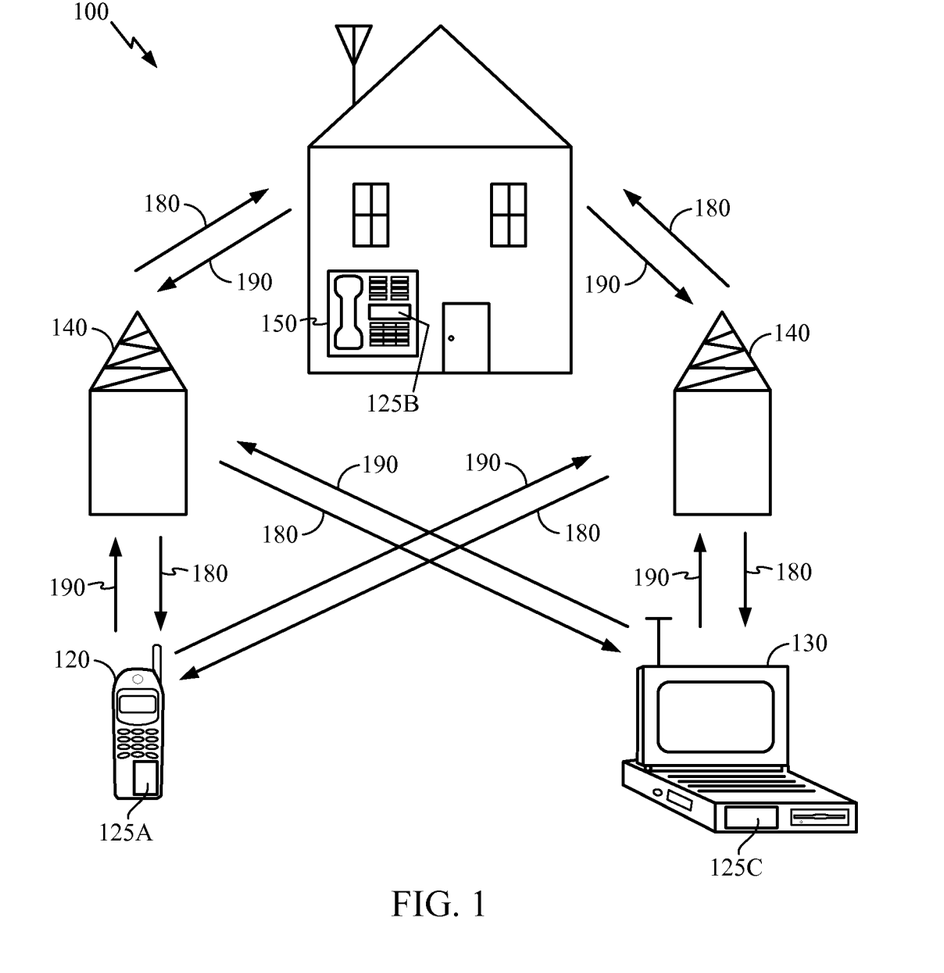
FIG. 1 is a block diagram showing an exemplary wireless communication system in which an embodiment of the disclosure may be advantageously employed.

FIG. 1 is a block diagram showing an exemplary wireless communication system 100 in which an embodiment of the disclosure may be advantageously employed. For purposes of illustration, FIG. 1 shows three remote units 120, 130, and 150 and two base stations 140. It will be recognized that wireless communication systems may have many more remote units and base stations. Remote units 120, 130, and 150 include IC devices 125A, 125B and 125C, that include the disclosed ESD recorder. It will be recognized that any device containing an IC may also include the ESD recorder disclosed here, including the base stations, switching devices, and network equipment. FIG. 1 shows forward link signals 180 from the base station 140 to the remote units 120, 130, and 150 and reverse link signals 190 from the remote units 120, 130, and 150 to base stations 140.

In FIG. 1, remote unit 120 is shown as a mobile telephone, remote unit 130 is shown as a portable computer, and remote unit 150 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 1 illustrates remote units according to the teachings of the disclosure, the disclosure is not limited to these exemplary illustrated units. Embodiments of the disclosure may be suitably employed in any device which includes integrated circuitry.

Figure 2:
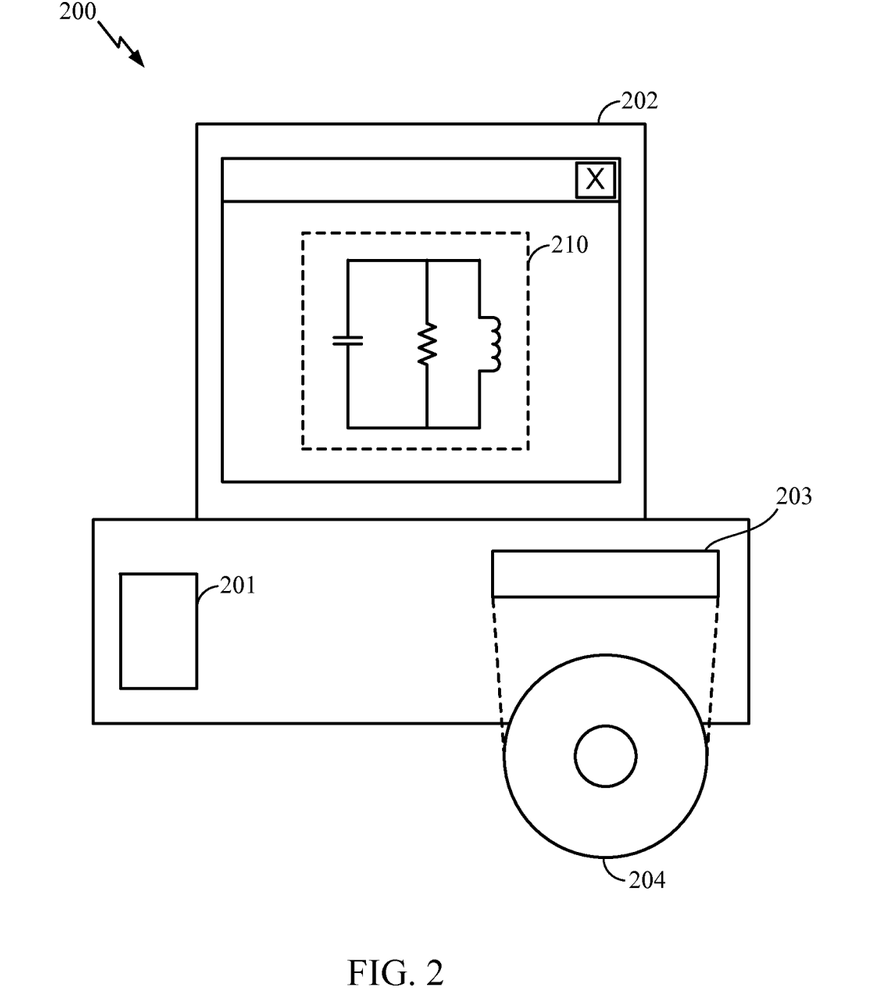
FIG. 2 is a block diagram illustrating a design workstation used for circuit, layout, and logic design of the disclosed semiconductor integrated circuit package.

FIG. 2 is a block diagram illustrating a design workstation used for circuit, layout, and logic design of the disclosed semiconductor integrated circuit. A design workstation 200 includes a hard disk 201 containing operating system software, support files, and design software such as Cadence or OrCAD. The design workstation 200 also includes a display to facilitate design of a circuit design 210. The circuit design 210 may be the packaging as disclosed below. A storage medium 204 is provided for tangibly storing the circuit design 210. The circuit design 210 may be stored on the storage medium 204 in a file format such as GDSII or GERBER. The storage medium 204 may be a CD-ROM, DVD, hard disk, flash memory, or other appropriate device. Furthermore, the design workstation 200 includes a drive apparatus 203 for accepting input from or writing output to the storage medium 204.

Data recorded on the storage medium 204 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 204 facilitates the design of the circuit design 210 by decreasing the number of processes for designing semiconductor ICs.

An ESD recorder circuit will be described below that allows for the recording of pulse current levels of ESD events that occur during bonding of multiple ICs. According to one embodiment, this is advantageous for monitoring ESD events during die-to-die bonding of stacked ICs. The ESD recorder is placed on a substrate in the stacked IC. After bonding of one or more tiers, the ESD recorder may be read out through contact pads coupled to the ESD recorder. Thus, the magnitude of the ESD events that occur during die-to-die bonding may be read out after bonding. The information read from the recorder may be used, for example, to optimize manufacturing procedures or design ESD protection circuitry for the stacked IC.

Figure 3:
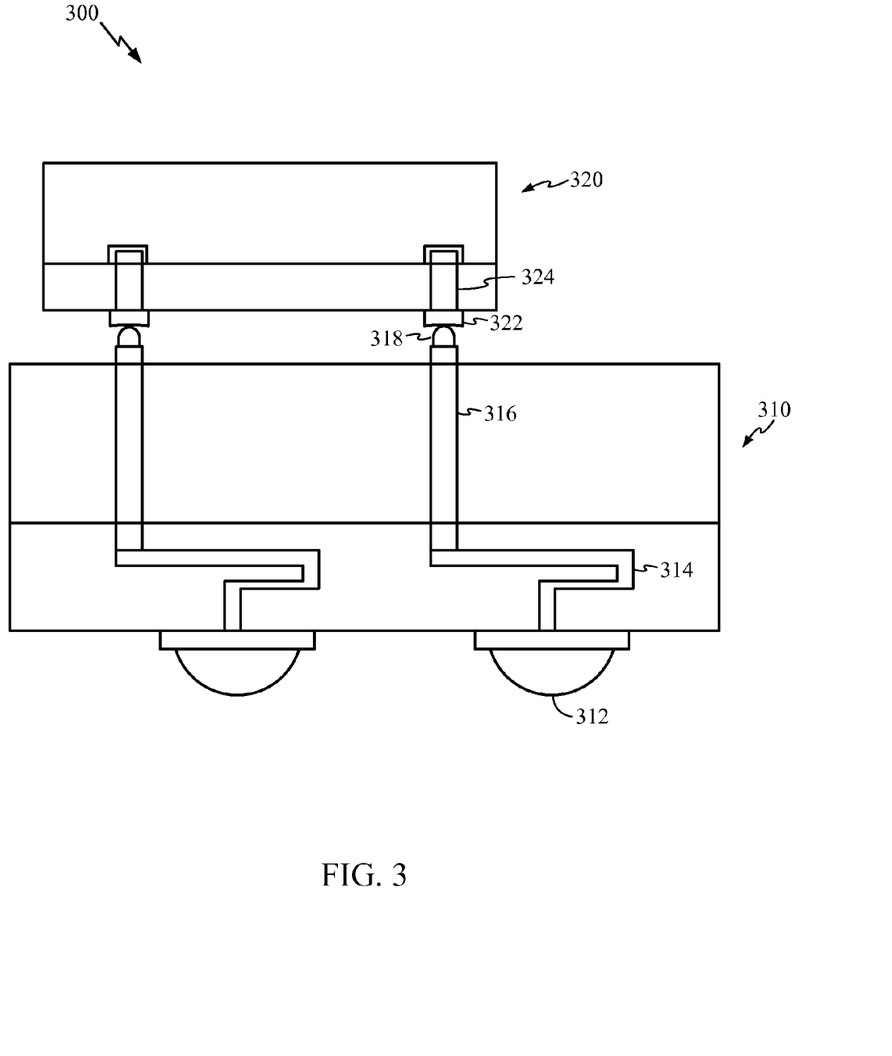
FIG. 3 is a block diagram illustrating a two-tier stacked IC.

FIG. 3 is a block diagram illustrating a two-tier stacked IC. A stacked IC 300 includes a first-tier IC 310 and a second-tier IC 320. Each IC 310, 320 may be manufactured in separate processing lines or at different facilities. Thus, the first-tier IC 310 and the second-tier IC 320 may be separate components. For example, according to one embodiment, the first-tier IC 310 may be a microprocessor, and the second-tier IC 320 may be a memory device such as dynamic random access memory (DRAM), static random access memory (SRAM), or flash memory. The first-tier IC 310 includes a packaging connection 312. The packaging connection 312 couples circuitry in the first-tier IC 310 to outside devices (not shown) and may be a ball grid array according to one embodiment. The packaging connection 312 may also be, for example, a fine ball grid array, pin grid array, or land grid array. Interconnects 314 of the first-tier IC 310 are coupled to the packaging connection 312 and through silicon vias 316. The through silicon vias 316 extend through the first-tier IC 310 to a contact pad 318. Additionally, a portion of the interconnects 314 may couple the packaging connection 312 to circuitry in the first-tier IC 310.

The second-tier IC 320 includes a tier-to-tier connection 322, which may be, for example, a ball or bump array. The tier-to-tier-connection 322 may be of a different type or same type as the packaging connection 312. The tier-to-tier connection 322 is coupled to the contact pad 318 to provide a path for signals from the first-tier IC 310 or other circuitry coupled to the first-tier IC 310 to couple to the second-tier IC 320. The interconnects 324 couple the tier-to-tier connection 322 to circuitry (not shown) in the second-tier IC 320.

When the first-tier IC 310 and the second-tier IC 320 are manufactured separately they are later bonded to couple the contact pad 318 and the tier-to-tier connection 322. During bonding of the first-tier IC 310 and the second-tier IC 320 ESD events occur when electrostatic charge stored on the first-tier IC 310 is at a different potential than charge stored on the second-tier IC 320. ESD events that occur during bonding may damage sensitive circuitry within the ICs 310, 320.

A design for recording the magnitude of ESD events that occurs during bonding will now be described. The design presented is not intended to be limited to die-to-die bonding, but is useful for measuring and/or recording ESD events that occur during any manufacturing or handling that may be subject to ESD events, such as flip chip bonding of an IC to a package substrate. The design may also be used to monitor assembly plants to determine if they are meeting ESD control guidelines.

Figure 4:
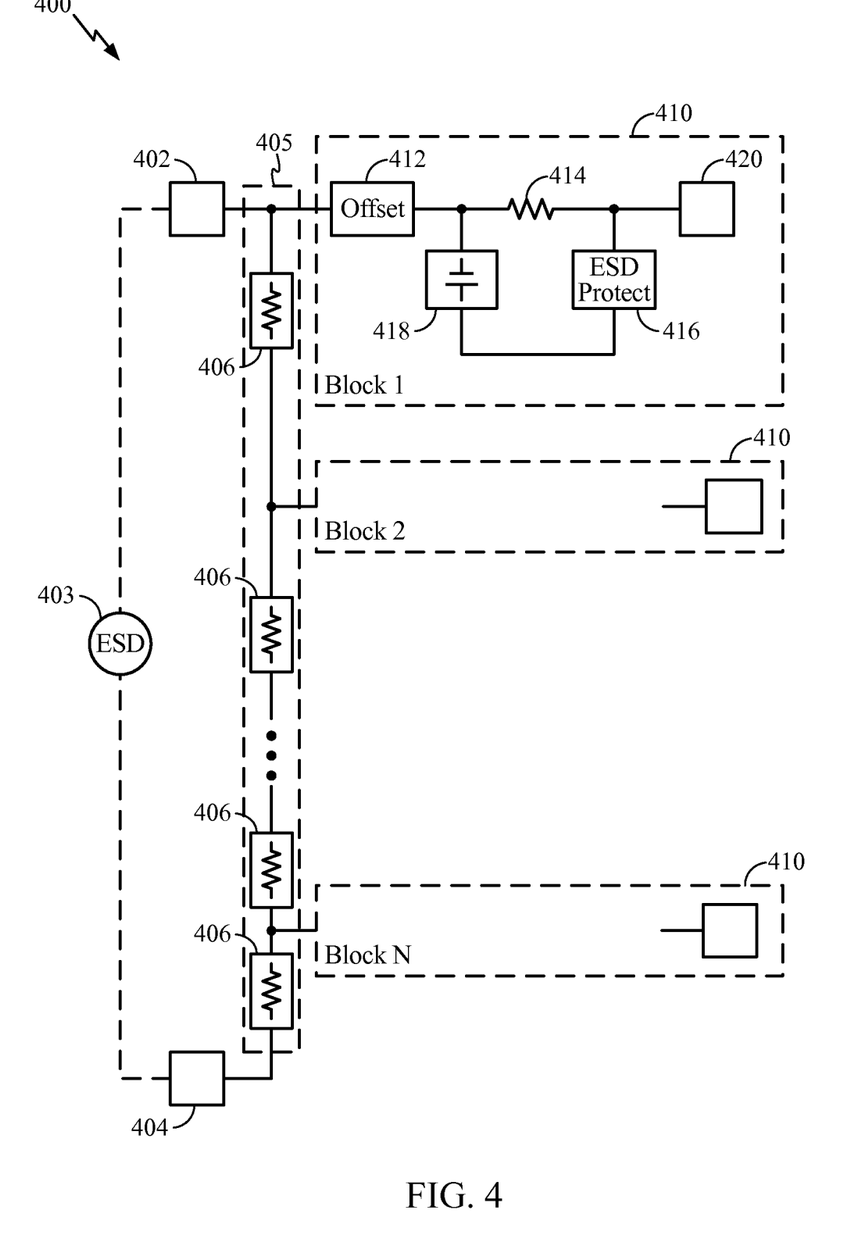
FIG. 4 is a circuit schematic illustrating an exemplary recorder of ESD events according to one embodiment.

FIG. 4 is a circuit schematic illustrating an exemplary recorder of ESD events according to one embodiment. An ESD recorder 400 includes a contact pad 402 for coupling to one terminal of an ESD source 403 and a contact pad 404 for coupling to a second terminal of an ESD source 403. An ESD event is represented as a voltage applied to the contact pads 402, 404 by the ESD source 403. For example, when a first IC is coupled to a second IC, a voltage difference between the first and the second ICs may be represented by the ESD source 403. The first IC and the second IC may be on separate substrates as with stacked ICs or they may be multiple dies on the source substrate such as multi-core processors or multi-bank memory devices.

Coupled to the contact pads 402, 404 is a voltage divider ladder 405. The voltage divider ladder 405 divides the voltage difference between the contact pads 402, 404 into discrete levels by using a series connection of energy dissipating devices 406. According to one embodiment, the energy dissipating devices 406 are substantially equally sized resistors, but the energy dissipating devices 406 may also be, for example, capacitors, inductors, diodes, or fuses. The number of the energy dissipating devices 406 determines, in part, the number of discrete levels of voltage that may be measured and the values of the energy dissipating devices 406 determine, in part, the sensitivity of the ESD recorder 400.

The energy dissipating devices 406 should have linear behavior in the operating region expected from the ESD source 403. For example, if the energy dissipating devices 406 have insufficient capacity to handle the ESD source 403 they may behave non-linearly due to heating or in extreme cases stop functioning. In the case of resistors, the dimensions of the resistors may be selected to ensure linear behavior. According to one embodiment, the resistor may be a p+ polysilicon resistor. The voltage tolerance for a standard 100 ns transmission line pulse (TLP) is 4.0V/μm which translates to 15V/μm for a 1 ns pulse. To achieve 90V tolerance the resistor length should be 6 μm. Extra protection is provided by increasing the length to 8 μm. For a resistivity of 757 Ω/sqr for p+ polysilicon and a desired resistance value of 1000Ω, the width of the resistor is 6.0 μm. The resistivity is calculated from R=L×ρ/w, where R is the resistance, L is the resistor length, w is the resistor width, and ρ is the resistivity. The translation from one pulse length to a second pulse length may be calculated by the appropriate equation for a pFET or nFET according to $$TDDB_{PFET} = \left(\frac{V_{oxP}}{0.340T_{ox} + 1.9}\right)^{-27} \text{ and} \quad (1)$$

$$TDDB_{NFET} = \left(\frac{V_{oxN}}{0.24T_{ox} + 2.1}\right)^{-30}, \quad (2)$$

where $TDDB_{NFET}$ is the time to failure of an nFET,
where $TDDB_{PFET}$ is the time to failure of a pFET,
$V_{oxP}$ is the gate oxide voltage of the pFET with respect to body, drain, and source, $V_{oxN}$ is the gate oxide voltage of the nFET with respect to body, drain, and source
$T_{ox}$ is the physical gate oxide thickness of the nFET After each of the energy dissipating devices 406, a measurement block 410 is coupled to the voltage divider ladder 405. Each measurement block 410 includes circuitry for measuring and/or recording the voltage level across the corresponding energy dissipating device 406. The measurement block 410 is repeated for each of the energy dissipating devices 406. That is, multiple measurement blocks 410 are implemented corresponding in part, to the number of the energy dissipating devices 406 in the voltage divider ladder 405.

The measurement block 410 includes a recorder device 418 for recording a voltage level across the energy dissipating device 406. According to one embodiment, the voltage at the recorder device 418 is large enough to permanently damage the recorder device 418. It may then be tested for damage to determine if the voltage experienced by the recorder device 418 exceeded a voltage known to cause damage to the recorder device 418. The recorder device 418 may be, for example, a capacitor, a fuse, a diode, a resistor, or a transistor. In the case of a gate oxide sensing device, such as a capacitor, a diode, or transistor, a voltage exceeding the dielectric breakdown of the capacitor's, diode's, or transistor's oxide causes permanent damage. One benefit of the capacitor is relative invariance to the length of the ESD event. In the case of a resistor, prolonged current causes ohmic heating leading to damage in the resistor material. One benefit of the resistor is that the ohmic heating is proportional to the duration of the ESD event. In the case of a fuse, a current exceeding the fuse's breaking capacity causes permanent damage.

The electrical conductivity of the recorder device 418 may be read out at a later time by test or measurement equipment. The measurement block 410 also includes an ESD protection circuit 416 coupled to the recorder device 418 and the measurement pad 420 to prevent ESD events unrelated to the ESD source 403 from interfering with the measurement block 410. For example, the ESD protection circuit 416 protects the measurement block 410 from an ESD event caused by the reading device. The ESD protection circuit 416 should be robust enough to protect the measurement block 410 from normal handling procedures.

Additionally, a resistor 414 is coupled to the recorder device 418 and to a measurement pad 420. The resistor 414 reduces the parasitic loading of the voltage across the recorder device 418 that may be caused by the ESD protection circuit 416. The measurement pad 420 may be used to read out a value related to the ESD event stored by the recorder device 418. In an alternate embodiment, the measurement blocks 410 are connected to a multiplexer to share the measurement pad 420.

The measurement block 410 further includes an offset device 412. The offset device 412 may have a high resistance for low voltage events. In the case of ESD current conduction at a higher voltage, the offset device has a low resistance. The offset device 412 insulates the voltage divider ladder 405 from read out of a measurement and may be, for example, a diode, a gated diode, or a transistor. In the case of a diode, conduction will not begin until a built-in potential of the diode is exceeded. For example, a built-in potential of 0.4 Volt prevents the diode from conducting during measurement of the recorder device 418. Thus, interference from the voltage divider ladder 405 does not alter read-out of the recorder device 418. Gated diodes permit measurements at low voltages and have fast response times.

Figure 5:
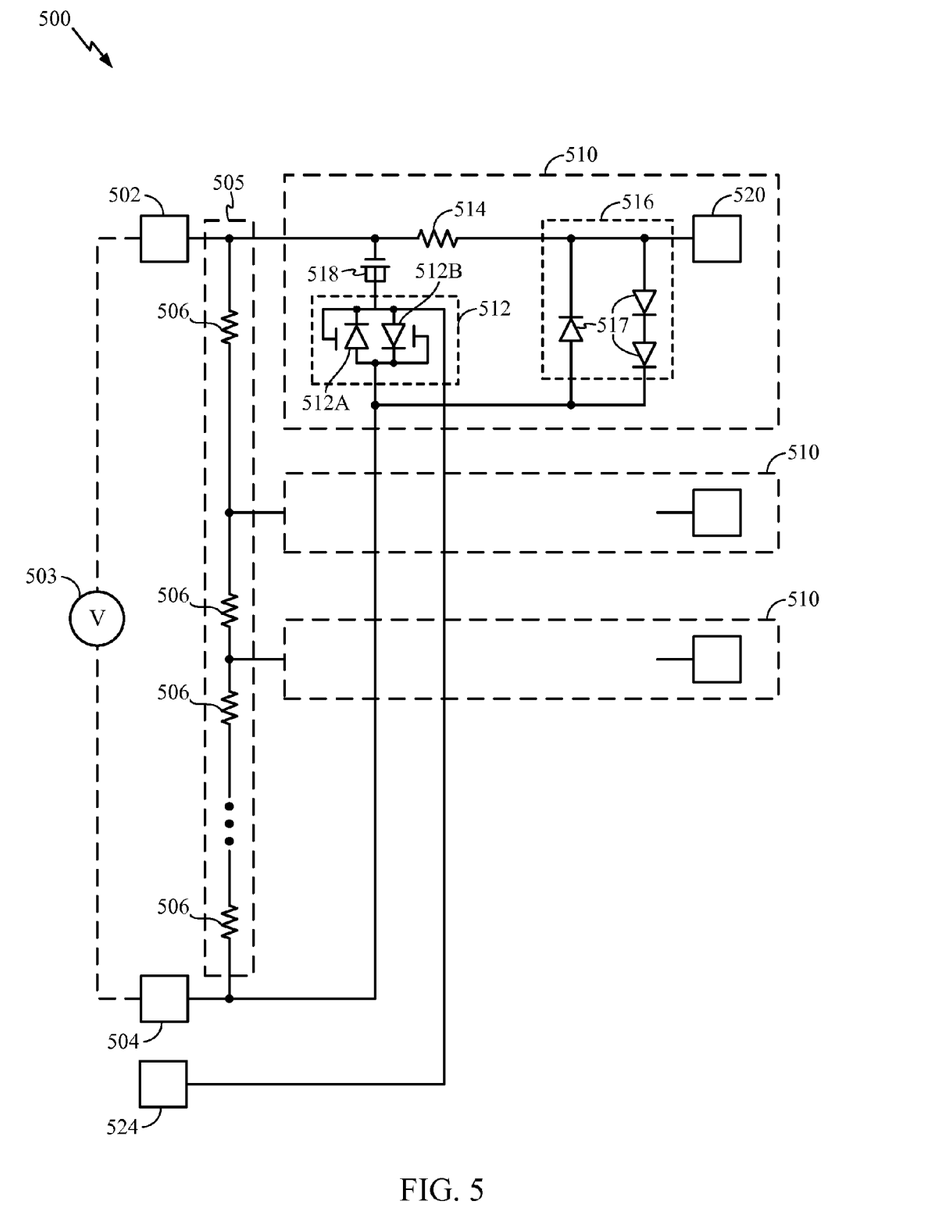
FIG. 5 is a circuit schematic illustrating an exemplary recorder of ESD events between a first-tier and a second-tier of a stacked IC implementing a pFET capacitor according to one embodiment.

Another embodiment of an ESD recorder will be described with respect to FIG. 5. FIG. 5 is a circuit schematic illustrating an exemplary recorder of ESD events between a first-tier and a second-tier of a stacked IC implementing a pFET capacitor according to one embodiment. An ESD recorder 500 includes a contact pad 502 for connecting to a ground plane of a second-tier IC and a contact pad 504 for connecting to a ground plane of a first-tier IC. A voltage divider 505 is coupled between the contact pad 502 and the contact pad 504. When die-to-die bonding occurs, a voltage 503 develops across the contact pads 502, 504 corresponding to the potential difference between the ground of the first-tier IC and the ground of the second-tier IC. The voltage 503 is divided between resistors 506 in the voltage divider 505. The number of the resistors 506 present and the values of the resistors 506 determines, in part, the sensitivity and the number of discrete detectable levels of ESD events that may be measured. In one embodiment, all of the resistors have substantially equal values.

A measurement block 510 is coupled to the voltage divider 505 for each of the resistors 506. The measurement block 510 includes a pFET capacitor 518, which is used to record the voltage level across the resistor 506. When the voltage level across the resistor 506 exceeds a breakdown voltage of the pFET capacitor 518 (commonly referred as the failure threshold), the oxide in the pFET capacitor 518 ruptures causing a permanent change in behavior of the pFET capacitor 518. The failure threshold is well defined and is a strong function of voltage and a weak function of time. The change in behavior of the pFET capacitor 518 after the rupture of the oxide may manifest as the pFET capacitor 518 behaving either as an open circuit or a closed circuit, depending on the voltage level that was applied. If the voltage level across resistor 506 slightly to moderately exceeds the breakdown voltage, the pFET capacitor 518 will behave as a closed circuit. If the voltage level across the resistor 506 significantly exceeds the breakdown voltage of the pFET capacitor 518, the pFET capacitor 518 will behave as an open circuit. In the present embodiment either type of failure may be detected and no distinction is made between the types of failure, although those skilled in the art will recognize that other embodiments are possible.

When oxide in the pFET capacitor 518 is damaged, a leakage current measured from the pFET capacitor 518 will be different from its nominal value. This condition may be detected by, for example, coupling a multimeter to the contact pad 520 and a ground connection and measuring resistance or an I-V curve of the pFET capacitor 518. The pFET capacitor 518 should be calibrated such that the measured leakage current can be correlated with the voltage level experienced. According to one embodiment, the pFET capacitor 518 is calibrated by a very fast transmission line pulser having a pulse width of 1 nanosecond. Additionally, each pFET capacitor 518 may be checked before die-to-die bonding to ensure each pFET capacitor 518 did not rupture due to non-ESD related events.

Thus, by measuring the behavior of the pFET capacitor 518, the voltage level across the resistor 506 may be determined to have exceeded or not exceeded the breakdown voltage of the pFET capacitor 518. The resistors 506 may be chosen to divide the voltage 503 in specific increments and the pFET capacitor 518 chosen to have a specific oxide breakdown voltage. Thus, a number of thresholds may be set in the circuit and detecting which thresholds were exceeded allows a determination of the voltage 503.

Additionally, the measurement block 510 includes an off-set generator 512 having gated diodes 512A, 512B. The gated diodes 512A, 512B offset the measured voltage by a threshold voltage of the gated diodes 512A, 512B. The measurement block 510 further includes an ESD protection circuit 516 including diodes 517 configured to protect the pFET capacitor 518 from ESD events resulting from sources other than die-to-die bonding, which may cause damage and interfere in measurement and/or recording of the voltage 503. For example, the ESD protection circuit protects from ESD events originating from the measurement pad 520. Additionally, a resistor 514 reduces the parasitic loading of the voltage across the pFET capacitor 518 that may be caused by the ESD protection circuit 516.

According to one embodiment, a P+ polysilicon 1 kΩ resistor is employed. The voltage tolerance for a standard 100 ns TLP is 4.0 V/μm which translates to 15 V/μm for a 1 ns pulse. Voltage tolerances for different pulses may be calculated by equations (1) and (2) above. Thus, for 90 V tolerance the resistor length should be 6 μm. To factor in a margin of error the resistor length is 8 μm. For a resistivity of 757 Ω/sqr and a value of 1 kΩ, the width of the resistor is 6.0 μm.

In combination with a contact pad 524, which acts as a ground, a measurement may be taken of the measurement block 510 to determine the state of the pFET capacitor 518. According to one embodiment, the measurement may be taken using 1 nanosecond pulses. In the case that a ball grid array is used to couple the measurement pad 520 and the contact pad 524 to a measurement device, the measurement pulse may be 100 nanoseconds and formulas are used to backtrack the measurement to an equivalent 1 nanosecond pulse.

The measurement block 510 is repeated for each of the resistors 506 in the voltage divider 505. According to one embodiment, the resistors 506 have equal values. The equation describing a recorded failure voltage and failure current of an ESD pulse is given by $$V_{in\_fail} = \frac{V_{ox}N}{n} \text{ and } I_{in\_fail} = \frac{V_{ox}N}{nR_{total}},$$

where $V_{in\_fail}$ is the voltage 503, n is the stage showing a first failure as the leakage measurement tester moves from the bottom of the voltage divider 505 to the top of the voltage divider 505, N is the number of the resistors 506 in the voltage divider 505, $V_{ox}$ is the gate oxide breakdown voltage of the pFET capacitor 518, and $R_{total}$ is a total resistance of the voltage divider 505.

When equating the stage showing the first failure, n, to the failure voltage, Vin_fail, the stage closest to ground is n=1. A reciprocal relationship exists between the failed stage, n, and the failure voltage, Vin_fail because the largest voltage is experienced at the top stage at the top of the voltage divider 505. For example, if the resistors 506 of the voltage divider 505 are all equal and N=10 and $V_{ox}$=8 Volts then readout of a bottom most block results in information to determine if an ESD event exceeded 80 Volts, which is the breakdown voltage of the pFET capacitor 518 gate oxide multiplied by the number of the resistors 506 in the voltage divider 505. Read-out of a second block results in information to determine if an ESD event exceeded 40 Volts, and readout of a third block results in information to determine if an ESD event exceeded 26.7 Volts.

According to another embodiment, the resistors 506 have different values. In this case, the readout of the measurement blocks 510 can be made to any desired functions.

According to yet another embodiment, the leakage current of the pFET capacitor 518 may be measured to provide information about the magnitude of the voltage 503. Damage done to the pFET capacitor 518 by the voltage 503 may not be large enough to cause a complete short or open circuit, however, smaller damage may change the leakage current of the pFET capacitor 518. Thus, a measurement of the leakage current of the pFET capacitor 518 compared to the calibrated leakage current for the pFET capacitor 518 indicates the magnitude of the voltage 503.

Figure 6:
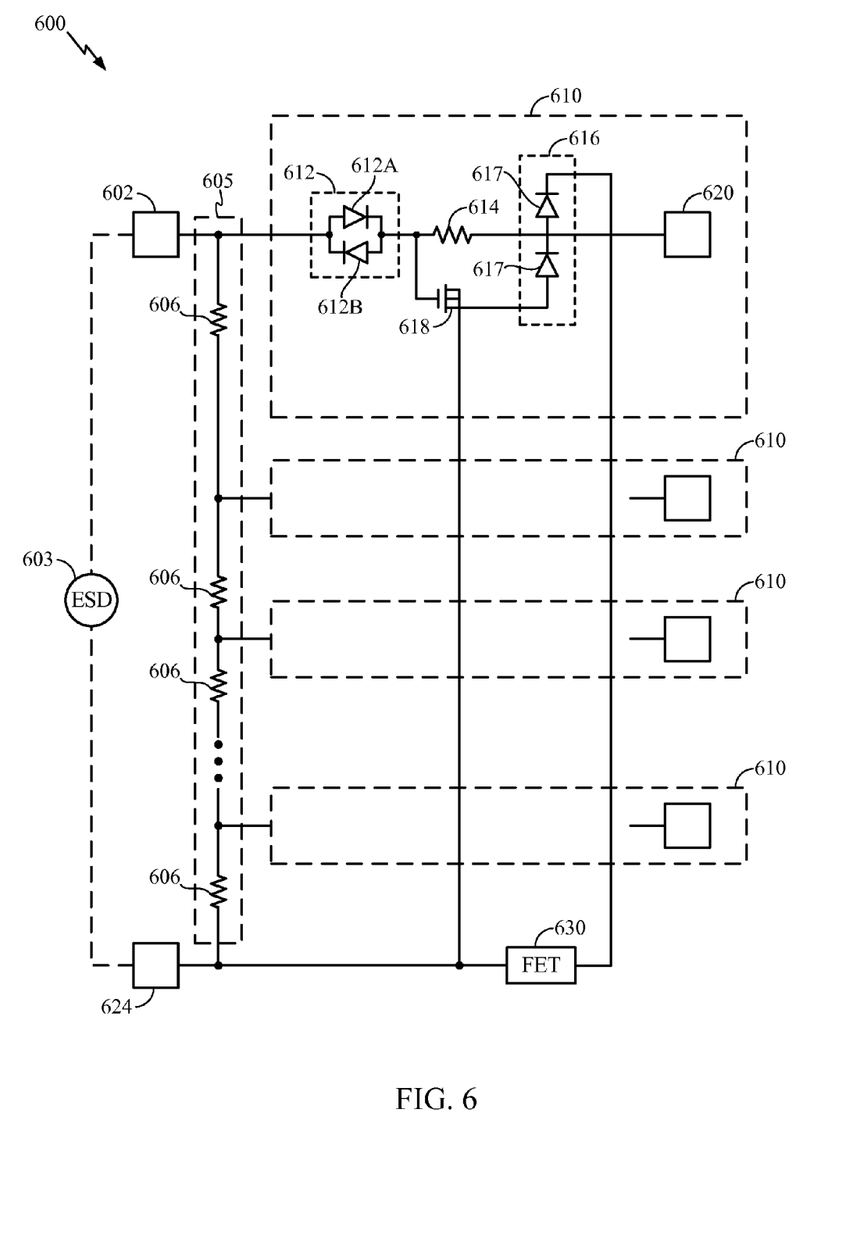
FIG. 6 is a circuit schematic illustrating an exemplary recorder of ESD events between a first-tier and a second-tier of a stacked IC implementing an nFET capacitor according to one embodiment.

A further embodiment of an ESD recorder will be described with respect to FIG. 6. FIG. 6 is a circuit schematic illustrating an exemplary recorder of ESD events between a first-tier and a second-tier of a stacked IC implementing an nFET capacitor according to one embodiment. An ESD recorder 600 includes a voltage divider ladder 605 coupled to a contact pad 602 and a contact pad 624. The contact pad 602 may be coupled to a second-tier substrate and the contact pad 624 to a first-tier substrate resulting in an ESD event upon bonding of the pads to the substrates represented by an ESD source 603 coupled to the contact pads 602, 624. The ESD source 603 is divided in the voltage divider ladder 605 over resistors 606. Each of the resistors 606 is coupled to a measurement block 610. A voltage offset block 612 includes cross-coupled diodes 612A, 612B coupled to the voltage divider ladder 605. An nFET capacitor 618 is coupled to the voltage offset block 612, the contact pad 624, and an ESD protection block 616. The ESD protection block 616 includes diodes 617 coupled to a FET 630. The diodes 617 and the FET 630 protect the nFET capacitor 618 from ESD events occurring during read-out from the contact pad 624 and a measurement pad 620. Further protection of the nFET capacitor 618 from ESD events during read-out is obtained from a resistor 614 coupled to the nFET capacitor 618 and the measurement pad 620. Read-out is accomplished by coupling a measurement device to the measurement pad 620 and the contact pad 624 and determining leakage current of the nFET capacitor 618 as described above. In the ESD recorder 600, the nFET capacitor 618 body is isolated from a substrate the ESD recorder 600 is built on. A deep n-well manufacturing technique may be used to build the nFET capacitor 618.

Figure 7:
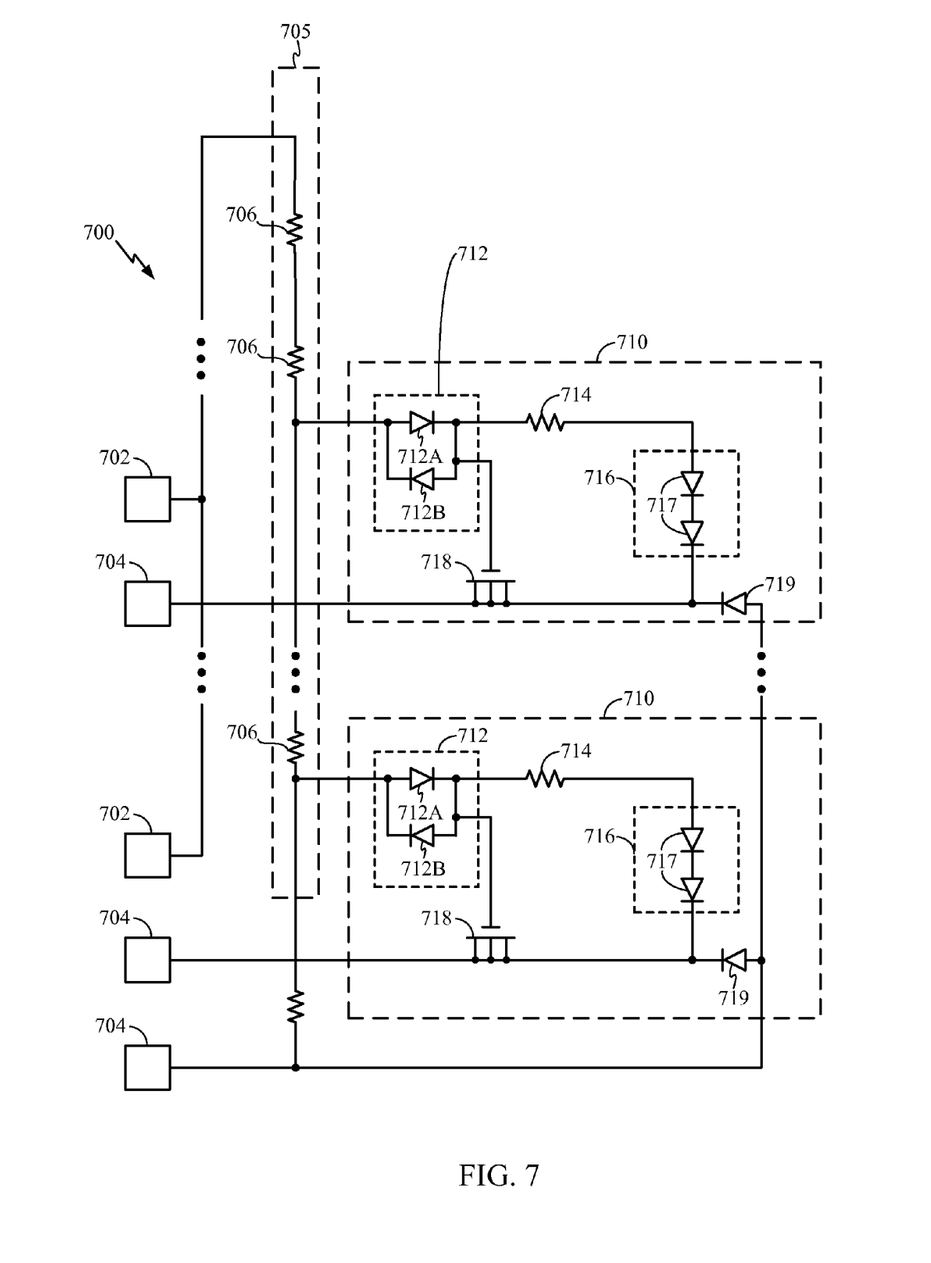
FIG. 7 is a circuit schematic illustrating an exemplary calibration circuit for an ESD recorder according to one embodiment.

Calibration of the ESD recorders illustrated in FIGS. 4, 5, and 6 may be accomplished using a separate test structure and a very fast transmission line pulse (VFTLP) tester. FIG. 7 is a circuit schematic illustrating an exemplary calibration circuit for an ESD recorder according to one embodiment. A calibration circuit 700 includes a voltage divider 705 including resistors 706. Coupled to each of the resistors 706 is a measurement block 710 that includes a capacitor 718 for recording the magnitude of an ESD event. Coupled to the capacitor 718 is a voltage offset block 712 that includes cross-coupled diodes 712A, 712B. Also coupled to the capacitor 718 is a resistor 714. Coupled to the resistor 714 is an ESD protection circuit 716 having diodes 717. A diode 719 coupled to the ground pad 704 is used to isolate the measurement block 410 from other circuitry, which provides more accurate DC measurements.

Input pads 702 and ground pads 704 are in a ground-signal configuration and are coupled to calibration equipment such as VFTLP that provides a voltage simulating an ESD event. Calibration is performed by applying a pulsed signal similar to that expected of ESD events. For example, a pulse signal may be 1 nanosecond in length. Following calibration a DC measurement is taken to determine leakage current from the capacitor 718. Ramping through a series of gradually larger input pulses and taking DC measurements generates a calibration table that may be used for looking up measurements obtained from the circuit of FIG. 4, 5, or 6. According to one embodiment, the input pads 702 and the ground pads 704 have a width and a height of 50 µm and are spaced 50 µm apart. The calibration circuit 700 may be located on any tier of a stacked IC.

Figure 10:
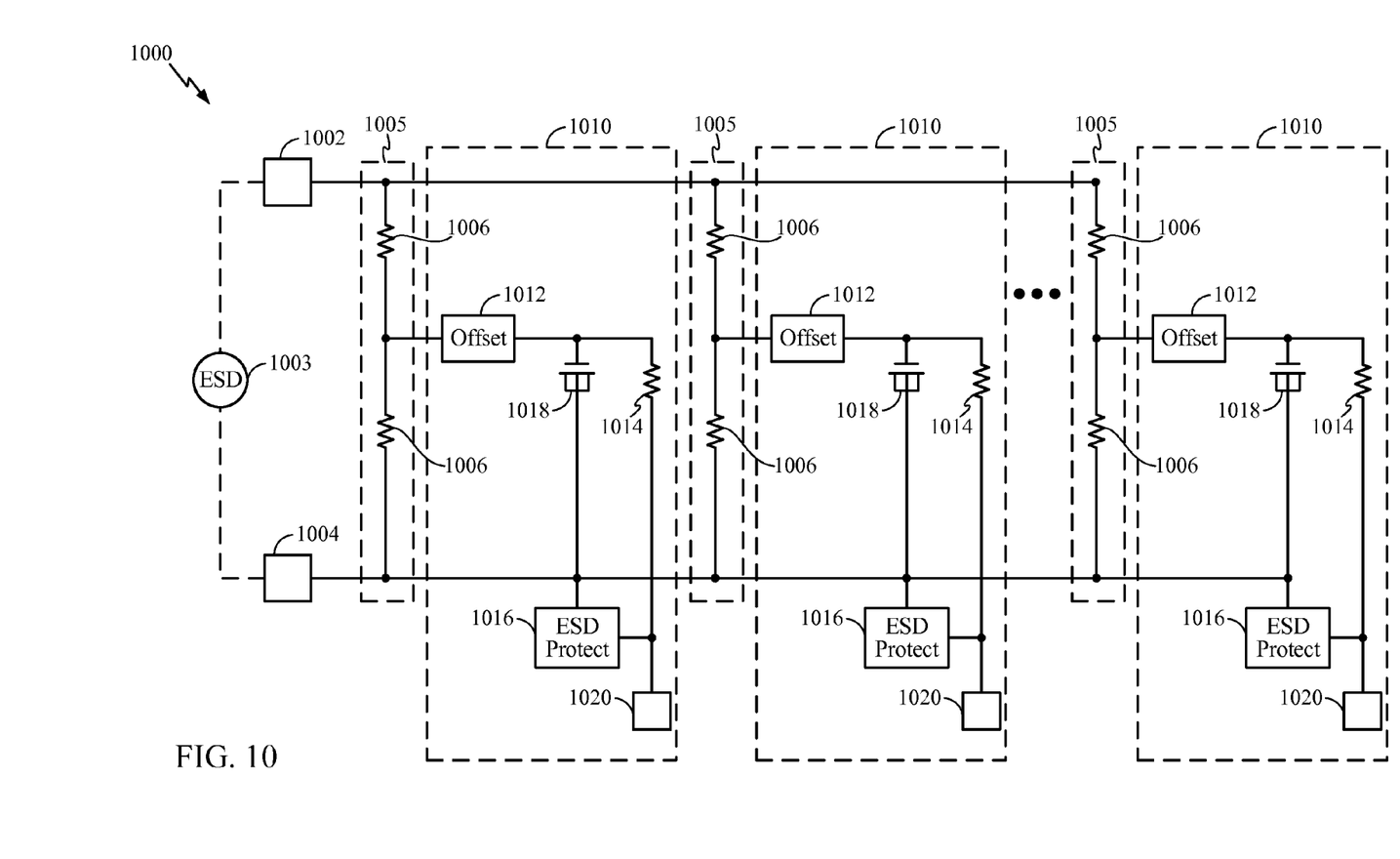
FIG. 10 is a circuit schematic illustrating an exemplary calibration circuit for an ESD recorder having parallel shunts according to one embodiment.

According to another embodiment, a parallel shunt with divider resistors in each shunt branch may be used to record ESD events as shown in FIG. 10. FIG. 10 is a circuit schematic illustrating an exemplary circuit for an ESD recorder having parallel shunts according to one embodiment. An ESD recorder 1000 includes a contact pad 1002 for connecting to a second IC and a contact pad 1004 for connecting to a first IC. A voltage divider 1005 is coupled between the contact pad 1002 and the contact pad 1004. The voltage 1003 is divided between resistors 1006 in the voltage divider 1005. The number of the resistors 1006 present and the values of the resistors 1006 determines, in part, the sensitivity and the number of discrete detectable levels of ESD events that may be measured.

A measurement block 1010 is coupled to the voltage divider 1005 for each pair of the resistors 1006. The measurement block 1010 includes a capacitor 1018, which is used to record the voltage level between the resistors 1006. When the voltage level between the resistors 1006 exceeds a breakdown voltage of the capacitor 1018, oxide in the capacitor 1018 ruptures causing a permanent change in behavior of the capacitor 1018. When oxide in the capacitor 1018 is damaged, a leakage current measured from the capacitor 1018 will be different from its nominal value. This condition may be detected by, for example, coupling a multimeter to a contact pad 1020 and the contact pad 1004 ground connection and measuring resistance or an I-V curve of the capacitor 1018. A voltage offset device 1012 for isolating the resistors 1006 may be located either in series with a gate of the capacitor 1018 or in series with a drain/source/body of the capacitor 1018. The equation describing a recorded failure is given by $$V_{in\_fail\_n} = \left(1 + \frac{R_{tn}}{R_{bn}}\right)(V_{ox} + V_{offset}),$$

where $V_{in\_fail\_n}$ is the input failing voltage for the nth measurement block, $R_{tn}/R_{bn}$ is the ratio of resistance values between resistors of the voltage divider for the nth measurement block, $V_{ox}$ is the oxide breakdown voltage, and $V_{offset}$ is the offset voltage provided by the voltage offset device.

The total input resistance of the circuit shown in FIG. 10 is given by $$R_{in} = \frac{1}{\frac{1}{R_{t1} + R_{b1}} + \frac{1}{R_{t2} + R_{b2}} + \ldots + \frac{1}{R_{tN} + R_{bN}}}.$$

Figure 8:
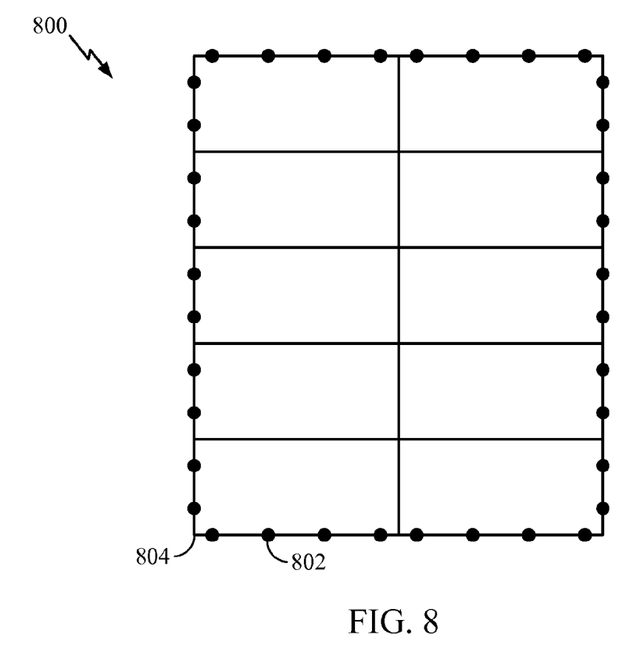
FIG. 8 is a block diagram illustrating electrical connections on a second-tier chip according to one embodiment.

Placement of an ESD recorder on an IC will be described with respect to FIGS. 8 and 9. FIG. 8 is a block diagram illustrating electrical connections on a second-tier chip according to one embodiment. A second-tier chip 800 includes a substrate ground ring 804. The substrate ground ring 804 may be a metal seal ring coupled to a substrate of the second-tier chip 800. Contacts 802 are coupled to the substrate ground ring 804. The contacts 802 may couple to a bonding interface such as, for example, a bump array that couples to another tier. Each of the contacts 802 may be tier-to-tier connections Coupling the contacts 802 to a sense ring of another tier will allow an ESD recorder, as described above, to be placed on the other tier of a stacked IC and measure ESD events that occur when the tiers are coupled to another tier.

Figure 9:
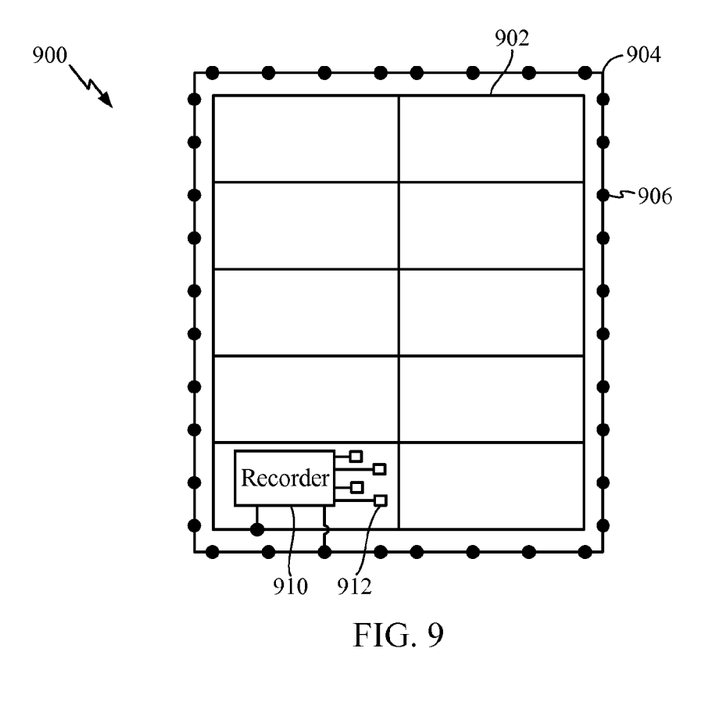
FIG. 9 is a block diagram illustrating electrical connections on a first-tier chip according to one embodiment.

FIG. 9 is a block diagram illustrating electrical connections on a first-tier chip according to one embodiment. A first-tier substrate 900 includes a ground ring 902 and a sense ring 904. The sense ring 904 includes contacts 906, which may couple to a bonding interface such as, for example, a bump array. Each of the contacts 906 may be tier-to-tier connections. When the contacts 906 are coupled to a bonding interface, the sense ring 904 may be coupled to another tier of a stacked IC. For example, the sense ring 904 may be coupled to the substrate ground ring 804 of the second-tier chip 800. When the sense ring 904 is coupled to the second-tier chip 800, an ESD event may be measured by an ESD recorder 910 integrated on the first-tier substrate 900. The ESD recorder 910 couples to the ground ring 902, for example at contact pads 404 of FIG. 4. Additionally, contact pads 912 for reading out the ESD recorder 910 are included on the first-tier substrate 900. The contact pads 912 may be also be coupled to a packaging interface for read-out.

When the first-tier substrate 900 is brought into contact with the second-tier chip 800, only one of the contacts 906 initially contacts a corresponding contact 802 on the second-tier chip 800 to ensure that the ESD is routed through the ESD recorder 910. At the time of contact, current flows from the second-tier chip 800 through the one of the contacts 906 to the sense ring 904 and through the ESD recorder 910 to the ground ring 902.

An ESD recorder device as described above allows for a measurement to be taken and record to be made of the voltage levels of an ESD event. In one embodiment, the ESD recorder measures and records voltages experienced by a stacked IC during die-to-die bonding. The voltage levels may be read out after the ESD event. The information obtained may be, for example, used to determine damage to the stacked IC as a result of ESD events or provide feedback to reduce ESD events during manufacturing. Knowing the magnitude of the ESD events produced during manufacturing and subsequently reducing the magnitude of the ESD events allows the amount of ESD protection circuits implemented on the chip be reduced. Reducing the amount of ESD protection circuits reduces the amount of IC occupied by ESD circuits, which reduces cost of the ICs. The ESD recorder as described has flexibility in adjusting sensitivity and resolution by changing the values of elements in the voltage divider.

The methodologies described herein may be implemented by various components depending upon the application. For example, these methodologies may be implemented in hardware, firmware, software, or any combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the terminology "through silicon via" includes the word silicon, it is noted that through silicon vias are not necessarily constructed in silicon. Rather, the material can be any device substrate material.

Although stacked ICs illustrated in the figures and described above only include two tiers, stacked ICs may contain many more tiers. The circuitry described may be adapted by one of ordinary skill in the art to Although specific circuitry has been set forth, it will be appreciated by those skilled in the art that not all of the disclosed circuitry is required to practice the disclosure. Moreover, certain well known circuits have not been described, to maintain focus on the disclosure.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A circuit for recording a magnitude of an electrostatic discharge (ESD) event during semiconductor assembly, the circuit comprising: a voltage divider connected between a first potential and a second potential, the voltage divider configured to provide a first node having a discrete voltage level different from the first potential and the second potential; and a first measurement block coupled to the first node, said first measurement block including a first recorder device configured to record the discrete voltage level, a first measurement contact pad configured to enable a read-out of said first recorder device via said first measurement contact pad, and a first resistor for coupling said first measurement contact pad to said first recorder.

2. The circuit of claim 1, in which the voltage divider comprises a plurality of energy dissipating devices connected in series between the first potential and the second potential.

3. The circuit of claim 2, in which the plurality of energy dissipating devices comprise resistors.

4. The circuit of claim 1, in which the voltage divider comprises a plurality of energy dissipating devices connected in parallel with the first potential and the second potential.

5. The circuit of claim 4, in which the plurality of energy dissipating devices comprise resistors.

6. The circuit of claim 1, in which the recorder device comprises an oxide layer capable of being damaged by the ESD event.

7. The circuit of claim 6, in which the recorder device comprises a capacitor.

8. The circuit of claim 1, wherein the first measurement block further comprises a voltage offset device that insulates the voltage divider from a read-out voltage applied to the first measurement contact pad during the read-out.

9. The circuit of claim 1, wherein the first measurement block further comprises an ESD protection circuit that protects the recorder device from a second ESD event that occurs during read-out.

10. The circuit of claim 1, wherein the first measurement block further comprises:
a first electrostatic discharge protection circuit coupled to said first measurement contact pad.

11. The circuit of claim 10, wherein said first measurement block further includes:
an offset device coupling said measurement device to said first node, said offset device insulating said voltage divider from read out via said measurement contact pad.

12. The circuit of claim 11, wherein said offset device is one of a diode, a gated diode or a transistor.

13. The circuit of claim 10, wherein said voltage divider includes multiple resistors arranged in series, said first node being positioned between a first pair of resistors in said voltage divider, a second node being positioned between a second pair of resistors in said voltage divider, said first and second nodes being arranged in series within said voltage divider; and wherein said circuit further includes:
a second measurement block coupled to said second node, said second measurement block including a second recorder device configured to record a discrete voltage level, a second measurement contact pad configured to enable a read-out of said second recorder device via said second measurement contact pad, and a second resistor for coupling said second measurement contact pad to said second recorder.

14. The circuit of claim 1, wherein said voltage divider is connected to first and second integrated circuit tier connection pads, said first potential existing at said first integrated circuit tier connection pad, said second potential existing at said second integrated circuit tier connection pad.

15. The circuit of claim 1, wherein said recorder device is a resistor.

16. The circuit of claim 1, wherein said recorder device is a fuse.

17. The circuit of claim 1, wherein said recorder device is a diode.

18. The circuit of claim 1, wherein said recorder device is a transistor.

19. The circuit of claim 1, wherein said recorder device is a capacitor which fails to an open state when exposed to a first breakdown voltage and which fails to a closed state when exposed to a second breakdown voltage.

20. A method of recording a magnitude of an electrostatic discharge (ESD) event during semiconductor assembly, the method comprising: providing a circuit including: a voltage divider connected between a first potential of a first semiconductor tier contact and a second potential of a second semiconductor tier contact, said first and second semiconductor tier contacts being contacts of a semiconductor tier bonded to another semiconductor tier, the voltage divider configured to provide a first node having a discrete voltage level different from the first potential and the second potential; and a first measurement block coupled to the first node, said first measurement block including a first recorder device configured to record the discrete voltage level, a first measurement contact pad configured to enable a read-out of said first recorder device via said first measurement contact pad, and a first resistor for coupling said contact pad to said first recorder; and reading out the magnitude of an electrostatic discharge event via said measurement contact pad.

21. The method of claim 20, wherein the voltage divider comprises a plurality of energy dissipating devices connected in series between the first potential and the second potential.

22. The method of claim 21, wherein the plurality of energy dissipating devices comprise resistors.

23. The method of claim 21, wherein reading out the magnitude of an electrostatic discharge event via said measurement contact pad includes:
reading the electrical conductivity of the recorder device.

* * * * *